(12) United States Patent
Lin

(10) Patent No.: US 12,532,495 B2
(45) Date of Patent: Jan. 20, 2026

(54) METHOD FOR FORMING SEMICONDUCTOR STRUCTURE

(71) Applicant: CHANGXIN MEMORY TECHNOLOGIES, INC., Hefei (CN)

(72) Inventor: Chao Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 447 days.

(21) Appl. No.: 18/150,850

(22) Filed: Jan. 6, 2023

(65) Prior Publication Data

US 2024/0047558 A1  Feb. 8, 2024

Related U.S. Application Data

(63) Continuation of application No. PCT/CN2022/113254, filed on Aug. 18, 2022.

(30) Foreign Application Priority Data

Aug. 4, 2022  (CN) .......................... 202210933222.3

(51) Int. Cl.
*H10D 30/01* (2025.01)
*H10B 12/00* (2023.01)
(Continued)

(52) U.S. Cl.
CPC ........... *H10D 30/031* (2025.01); *H10B 12/01* (2023.02); *H10D 30/014* (2025.01);
(Continued)

(58) Field of Classification Search
CPC .. H10D 30/031; H10D 30/014; H10D 30/673; H10D 62/113; H10D 64/018;
(Continued)

(56) References Cited

U.S. PATENT DOCUMENTS 9,917,100 B2  3/2018  Zhang
10,038,054 B2  7/2018  Rachmady et al.
(Continued)

FOREIGN PATENT DOCUMENTS

| CN | 104054181 A | 9/2014 |
| CN | 111223778 A | 6/2020 |

(Continued)

OTHER PUBLICATIONS

International Search Report in the international application No. PCT/CN2023/098689, mailed on Aug. 3, 2023, 3 pages.
(Continued)

*Primary Examiner* — Mohammad A Rahman
(74) *Attorney, Agent, or Firm* — Syncoda LLC; Feng Ma

(57) ABSTRACT

A method for forming a semiconductor structure is provided. The method includes: providing a base, the base including a first area and second areas located outside the first area, the first area including stack structures and isolation trenches alternately arranged in a first direction, the first direction being any direction in a plane where the base is located; performing ion implantation on sidewalls of the stack structure in the first direction, so as to form an active virtual connecting layer extending in the first direction and partially located in the isolation trenches; and forming a gate structure on a surface of the active virtual connecting layer.

16 Claims, 14 Drawing Sheets

(51) Int. Cl.
*H10D 30/67* (2025.01)
*H10D 62/10* (2025.01)
*H10D 64/01* (2025.01)

(52) U.S. Cl.
CPC ......... *H10D 30/673* (2025.01); *H10D 62/113* (2025.01); *H10D 64/018* (2025.01)

(58) Field of Classification Search
CPC ............... H10D 30/43; H10D 30/6735; H10D 30/6757; H10D 62/121; H10D 84/83; H10B 12/01; H10B 12/05; B82Y 10/00
See application file for complete search history.

(56) References Cited

U.S. PATENT DOCUMENTS

| | | | |
|---|---|---|---|
| 11,502,086 | B2 | 11/2022 | Son et al. |
| 12,052,854 | B2 | 7/2024 | Okajima |
| 2013/0341704 | A1 | 12/2013 | Rachmady |
| 2017/0148811 | A1 | 5/2017 | Zhang |
| 2017/0154960 | A1 | 6/2017 | Rachmady et al. |
| 2019/0103407 | A1 | 4/2019 | Kim |
| 2019/0326288 | A1 | 10/2019 | Hashemi et al. |
| 2020/0075599 | A1 | 3/2020 | Hashemi et al. |
| 2020/0279601 | A1 | 9/2020 | Kim et al. |
| 2021/0036146 | A1 | 2/2021 | Zhou |
| 2021/0183862 | A1 | 6/2021 | Son |
| 2021/0202479 | A1 | 7/2021 | Naskar et al. |
| 2021/0408047 | A1 | 12/2021 | Wang et al. |
| 2022/0093626 | A1 | 3/2022 | Shin |
| 2022/0102358 | A1 | 3/2022 | Park |
| 2022/0157819 | A1 | 5/2022 | Jung |
| 2022/0209003 | A1 | 6/2022 | Zhou |
| 2022/0416049 | A1 | 12/2022 | Shao |
| 2023/0014052 | A1 | 1/2023 | Tang |
| 2023/0014263 | A1 | 1/2023 | Huang |
| 2023/0015279 | A1* | 1/2023 | Shao ................ H10B 12/033 |
| 2023/0017086 | A1 | 1/2023 | Li |
| 2023/0261075 | A1 | 8/2023 | Gardner |
| 2024/0047558 | A1 | 2/2024 | Lin |

FOREIGN PATENT DOCUMENTS

| | | | |
|---|---|---|---|
| CN | 111435643 A | | 7/2020 |
| CN | 111627885 A | | 9/2020 |
| CN | 112309860 A | | 2/2021 |
| CN | 112992902 A | | 6/2021 |
| CN | 113437079 A | | 9/2021 |
| CN | 113497036 A | | 10/2021 |
| CN | 114121819 A | * | 3/2022 |
| CN | 114121820 A | | 3/2022 |
| CN | 114141712 A | | 3/2022 |
| CN | 114420644 A | | 4/2022 |
| CN | 115295551 A | | 11/2022 |

OTHER PUBLICATIONS

International Search Report in the international application No. PCT/CN2022/113254, mailed on Dec. 22, 2022, 4 pages.
International Search Report in the international application No. PCT/CN2022/112940, mailed on Dec. 20, 2022, 4 pages.
US office action in U.S. Appl. No. 18/178,567, mailed on Jul. 14, 2025.

* cited by examiner

METHOD FOR FORMING SEMICONDUCTOR STRUCTURE

CROSS-REFERENCE TO RELATED APPLICATIONS

This application is a U.S. continuation application of International Application No. PCT/CN2022/113254, filed Aug. 18, 2022, which claims priority to Chinese Patent Application No. 202210933222.3, filed Aug. 4, 2022. International Application No. PCT/CN2022/113254 and Chinese Patent Application No. 202210933222.3 are incorporated herein by reference in their entireties.

BACKGROUND

A Three Dimensions Dynamic Random Access Memory (3D DRAM) can extend in a vertical direction, which is the development direction of a DRAM technology in the future. In a related art, the gate structure of the 3D DRAM can be selected from a Gate All Around (GAA) structure or a dual gate structure. The gate structures of two adjacent transistors of transistors located in a same layer are isolated by an electron barrier layer, for example, by air or a dielectric, and the gate structures of two adjacent transistors of the transistors located in the same layer need to be led out by a same gate metal layer (i.e. a word line). However, in the 3D DRAM in the related art, a gate metal layer connecting the gate structures of the two adjacent transistors of the transistors in the same layer and the gate structure of each transistor located in the same layer cannot be formed at the same time, so a preparation process is complex.

SUMMARY

The disclosure relates to the technical field of semiconductors, and relates, but is not limited, to a method for forming a semiconductor structure.

The embodiments of the disclosure provide a method for forming a semiconductor structure. The method includes the following operations.

A base is provided. The base includes a first area and second areas located outside the first area. The first area includes stack structures and isolation trenches alternately arranged in a first direction. The first direction is any direction in a plane where the base is located.

Ion implantation is performed on sidewalls of the stack structure in the first direction, so as to form an active virtual connecting layer extending in the first direction and partially located in the isolation trenches.

A gate structure is formed on a surface of the active virtual connecting layer.

BRIEF DESCRIPTION OF THE DRAWINGS

In the drawings (which are not necessarily drawn to scale), similar drawing signs may describe similar parts in different views. Similar drawing signs with different letter suffixes may represent different examples of similar parts. The drawings generally illustrate the various embodiments discussed herein by way of examples rather than limitation.

Figure 1:
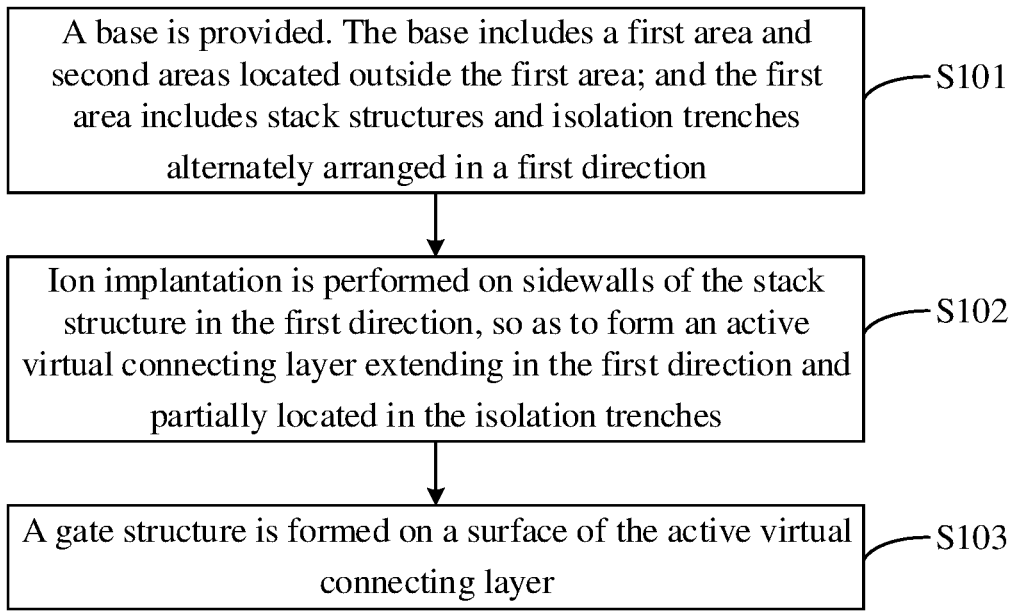
FIG. 1 illustrates a schematic flowchart of a method for forming a semiconductor structure provided by the embodiments of the disclosure.

Reference signs in the drawings are described as follows. 10—semiconductor substrate; 11—stack structure; 11a—initial stack structure; 111—first semiconductor layer; 112—second semiconductor layer; 12—dielectric layer; 13—isolation trench; 14—mask layer with preset pattern; 15—etching groove; 16—sacrificial structure; 161—first sacrificial layer; 162—second sacrificial layer; 17—support structure; 18a—first surface; 18b—second surface; 19—active virtual connecting layer; 191—active layer; 192—virtual connecting layer; 20a—third surface; 20b—fourth surface; 21—gate structure; 211—gate dielectric layer; 212—gate conductive layer; 22—second isolation structure; 23—first opening; 100—semiconductor structure; A—first area; B—second area; and F—sub-preset pattern.

DETAILED DESCRIPTION

Exemplary implementation modes of the disclosure will be described below in more detail with reference to the drawings. Although the exemplary implementation modes of the disclosure are shown in the drawings, it should be understood that, the disclosure may be implemented in various forms and should not be limited by the specific implementation modes elaborated herein. On the contrary, these implementation modes are provided to enable a more thorough understanding of the disclosure and to fully convey the scope of the disclosure to those skilled in the art.

In the following description, a large number of specific details are given in order to provide a more thorough understanding of the disclosure. However, it will be apparent to those skilled in the art that the disclosure may be implemented without one or more of these details. In other examples, in order to avoid confusion with the disclosure, some technical features known in the art are not described. That is, not all the features of the actual embodiments are described here, and the known functions and structures are not described in detail.

In the drawings, the dimensions of layers, areas, and elements and their relative dimensions may be exaggerated for clarity. Throughout, the same drawing signs represent the same elements.

It is to be understood that when an element or layer is referred to as being "above", "adjacent to", "connected to", or "coupled to" another element or layer, the element or layer may be directly above, adjacent to, connected to or coupled to the other element or layer, or there may be an intermediate element or layer. On the contrary, when an element is referred to as being "directly on", "directly adjacent to", "directly connected to" or "directly coupled to" another element or layer, there is no intermediate element or layer. It is to be understood that, although various elements, components, areas, layers, and/or parts may be described with terms first, second, third, etc., these elements, components, areas, layers, and/or parts should not be limited to these terms. These terms are used only to distinguish one element, component, area, layer, or part from another element, component, area, layer or part. Therefore, a first element, component, area, layer, or part discussed below may be represented as a second element, component, area, layer, or part without departing from the teaching of the disclosure. However, when the second element, component, area, layer, or part is discussed, it does not mean that the first element, component, area, layer, or part must exist in the disclosure.

The terms used herein are intended only to describe specific embodiments and are not a limitation of the disclosure. As used herein, singular forms "a", "an", and "said/the" may also be intended to include the plural forms, unless otherwise specified in the context. It is also to be understood that terms "composed of" and/or "including", when used in this specification, determine the presence of the features, integers, steps, operations, elements, and/or components, but do not exclude the presence or addition of one or more other features, integers, steps, operations, elements, components, and/or groups. As used herein, terms "and/or" includes any and all combinations of the related listed items.

Before introducing the embodiments of the disclosure, three directions for describing a three-dimensional structure that may be used in the following embodiments are defined first. Taking a Cartesian coordinate system as an example, the three directions may include an X-axis direction, a Y-axis direction, and a Z-axis direction. The base may include a top surface located on a front side and a bottom surface located on a back side opposite to the front side. The direction intersecting (for example, being perpendicular to) the top surface and the bottom surface of the base is defined as the third direction in a case of ignoring the flatness of the top surface and the bottom surface. In the direction of the top surface and bottom surface of the base (i.e. the plane where the substrate is located), two directions that intersect each other (for example, that are perpendicular to each other) are defined. For example, the extending direction of the support structure may be defined as a first direction, and the arrangement direction of the support structures may be defined as a second direction. The direction of the plane where the base is may be determined on the basis of the first direction and the second direction. In the embodiments of the disclosure, the first direction, the second direction, and the third direction may be perpendicular to each other in pairs. In other embodiments, the first direction, the second direction, and the third direction may also be not perpendicular to each other. In the embodiments of the disclosure, the first direction is defined as an X-axis direction, the second direction is defined as the Y-axis direction, and the third direction is defined as the Z-axis direction.

The embodiments of the disclosure provide a method for forming a semiconductor structure. FIG. 1 illustrates a schematic flowchart of a method for forming a semiconductor structure provided by the embodiments of the disclosure. As shown in FIG. 1, the method for forming a semiconductor structure includes the following operations.

At S101, a base is provided. The base includes a first area and second areas located outside the first area. The first area includes stack structures and isolation trenches alternately arranged in a first direction.

In the embodiments of the disclosure, the base at least includes a semiconductor substrate. The semiconductor substrate may be a silicon substrate. The semiconductor substrate may also include other semiconductor elements such as germanium (Ge), or semiconductor compounds such as silicon carbide (SiC), gallium arsenide (GaAs), gallium phosphide (GaP), indium phosphide (InP), indium arsenide (InAs), or indium antimonide (InSb), or other semiconductor alloys such as silicon germanium (SiGe), gallium arsenide phosphide (GaAsP), indium aluminum arsenide (AlInAs), gallium aluminum arsenide (AlGaAs), indium gallium arsenide (GaInAs), indium gallium phosphide (GaInP), and/or indium gallium arsenide phosphide (GaInAsP), or a combination thereof.

In the embodiments of the disclosure, the first area and the second area may respectively be used to form different functional structures. For example, the first area may be used to form a gate structure. The second area may be used to form other semiconductor structures such as a word line structure, a capacitor structure, or a bit line structure.

In the embodiments of the disclosure, the stack structure includes first semiconductor layers and second semiconductor layers stacked alternately in the third direction from bottom to top. The material of the first semiconductor layer may be Ge, SiGe, or SiC, or may also be a Silicon-On-Insulator (SOI) or a Germanium-on-Insulator (GOI). The second semiconductor layer may be a silicon layer, or may also include other semiconductor elements such as Ge, or include semiconductor compounds such as SiC, GaAs, GaP, InP, InAs, or InSb, or include other semiconductor alloys such as SiGe, GaAsP, AlInAs, AlGaAs, GaInAs, GaInP, and/or GaInAsP, or a combination thereof.

In the embodiments of the disclosure, the materials of the first semiconductor layer and the second semiconductor layer are different, because part of the first semiconductor layer needs to be removed and the second semiconductor layer needs to be remained subsequently. Therefore, the first semiconductor layer has a greater etching selectivity relative to the second semiconductor layer. For example, the etching selectivity of the first semiconductor layer relative to the second semiconductor layer may be 5 to 15, so that the first semiconductor layer is etched and removed more easily relative to the second semiconductor layer during etching.

At S102, ion implantation is performed on sidewalls of the stack structure in the first direction, so as to form an active virtual connecting layer extending in the first direction and partially located in the isolation trenches.

In some embodiments, the active virtual connecting layer includes active layers and virtual connecting layers alternately arranged in first direction. The active layer and the virtual connecting layer may be formed by the following operation: ion implantation at a preset depth is performed on two ends of the second semiconductor layer in the stack structure in the first direction by a Plasma Doping (PLAD) technology, so as to form the virtual connecting layer. The second semiconductor layer not subjected to the ion implantation constitutes the active layer. The preset depth is less than the initial dimension of the second semiconductor layer in the stack structure. The material used for performing the ion implantation may be oxygen atoms or other materials containing oxygen atoms.

In the embodiments of the disclosure, an annealing process will be performed after the ion implantation at a preset depth is performed on two ends of the stack structure in the first direction, so that the implanted ions react with the second semiconductor layer with a preset depth, thereby forming a virtual connecting layer extending in the first direction.

In some embodiments, the second semiconductor layer includes a first surface and a second surface in the first direction. The ion implantation and the annealing process are performed on the second semiconductor layer along the first surface, so as to form a first virtual connecting layer extending in the first direction. The ion implantation and the annealing process are performed on the second semiconductor layer along the second surface, so as to form a second virtual connecting layer extending in the first direction. The first virtual connecting layer and the second virtual connecting layer located in a same isolation trench constitute the virtual connecting layer.

It is to be noted that, in the embodiments of the disclosure, the first virtual connecting layer and the second virtual connecting layer are formed simultaneously. That is to say, the ion implantation processes along the first surface and the second surface are performed simultaneously, and subsequent annealing processes are also performed simultaneously.

In the embodiments of the disclosure, a first virtual connecting layer with a second preset dimension or a second virtual connecting layer with a second preset dimension will be generated by consuming a second semiconductor layer of a first preset dimension. The second preset dimension is greater than the first preset dimension. Therefore, the dimension of the isolation trench in the first direction in the embodiments of the disclosure has a maximum value, otherwise the first virtual connecting layer and the second virtual connecting layer in a same isolation trench will not be connected to form the virtual connecting layer.

In some embodiments, when the material of the second semiconductor layer is silicon, the second semiconductor layer is doped by using oxygen atoms. When the doping depth is 1 nm, silicon of 1 nm is consumed and silicon oxide of about 2.17 nm will be formed. Then, the maximum dimension of the isolation trench in the first direction is 2.34 nm. When the dimension of the isolation trench in the first direction exceeds 2.34 nm, then the first virtual connecting layer and the virtual connecting layer cannot be connected together. Therefore, the first dimension of the isolation trench in the first direction is less than or equal to a preset multiple of the second dimension of the virtual connecting layer in the first direction. The preset multiple may be 0.54 times.

It is to be noted that in the embodiments of the disclosure, the first semiconductor layer is also doped while plasma doping is performed on the stack layer. However, since the materials of the first semiconductor layer and the second semiconductor layer are different, the first semiconductor layer does not react with the doped ions during annealing, and thus the first semiconductor layer still remains unchanged.

The virtual connecting layer in the embodiments of the disclosure, on one hand, can achieve the connection of two active layers arranged in the first direction, and facilitate subsequent formation of a gate metal layer connecting the gate structures in a same layer; and on the other hand, can serve as an electron barrier layer to isolate two adjacent gate structures in the first direction, which reduces the generation of leakage current, thereby improving the yield of the manufactured semiconductor structures.

At S103, a gate structure is formed on a surface of the active virtual connecting layer.

In the embodiments of the disclosure, the gate structure includes a gate dielectric layer and a gate conductive layer located on a surface of the gate dielectric layer.

In the embodiments of the disclosure, the material of the gate dielectric layer may be silicon oxide or other suitable materials. The material of the gate conductive layer may be any one of the materials with good electrical conductivity, such as anyone of titanium (Ti), titanium nitride (TiN), tungsten nitride (WN), tungsten (W), cobalt (Co), platinum (Pt), palladium (Pd), ruthenium (Ru), and Copper (Cu).

In the embodiments of the disclosure, the gate dielectric layer and the gate conductive layer may be formed through any suitable deposition process, such as a Chemical Vapor Deposition (CVD) process, a Physical Vapor Deposition (PVD) process, an Atomic Layer Deposition (ALD) process, a spin coating process, or a coating process or a furnace tube process.

In the embodiments of the disclosure, a stack structure that is formed by stacking a plurality of gate structures in the third direction may form a three-dimensional semiconductor structure, so as to improve the integration degree of the semiconductor structure and realize miniaturization.

In the embodiments of the disclosure, a virtual connecting layer connecting two active layers in a first direction is formed during forming a semiconductor structure. The virtual connecting layer can facilitate subsequent formation of a gate metal layer connecting gate structures in the same layer, which simplifies a process of the gate structures, and thus reduces the manufacturing cost of the semiconductor structure. In addition, the virtual connecting layer can also serve as an electronic barrier layer to isolate adjacent gate structures in the same layer, which reduces the generation of leakage current, thereby improving the yield of the manufactured semiconductor structures.

Figure 2A:
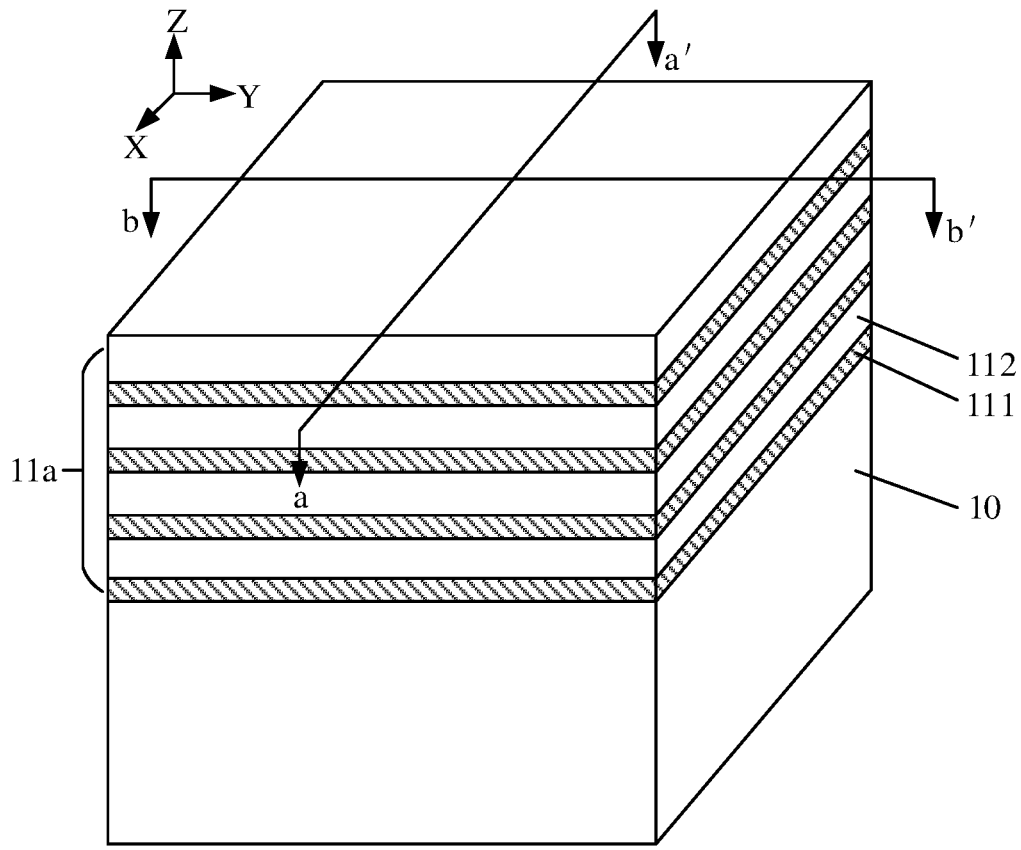
FIG. 2A to FIG. 2P illustrate schematic structural diagrams of a process for forming a semiconductor structure provided by the embodiments of the disclosure.
Figure 2B:
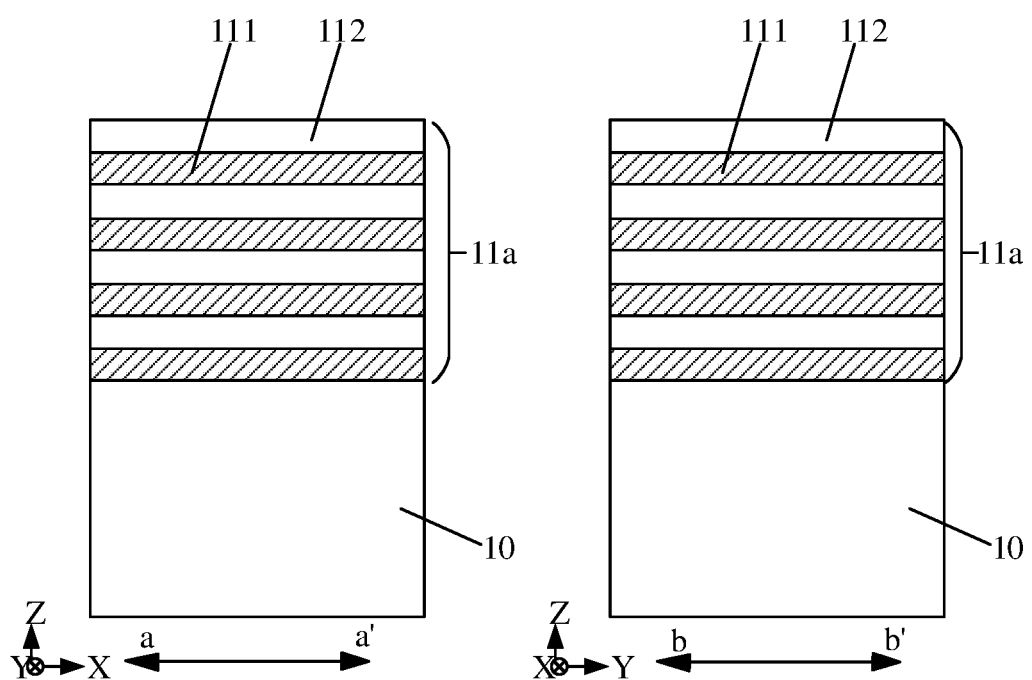
Figure 2C:
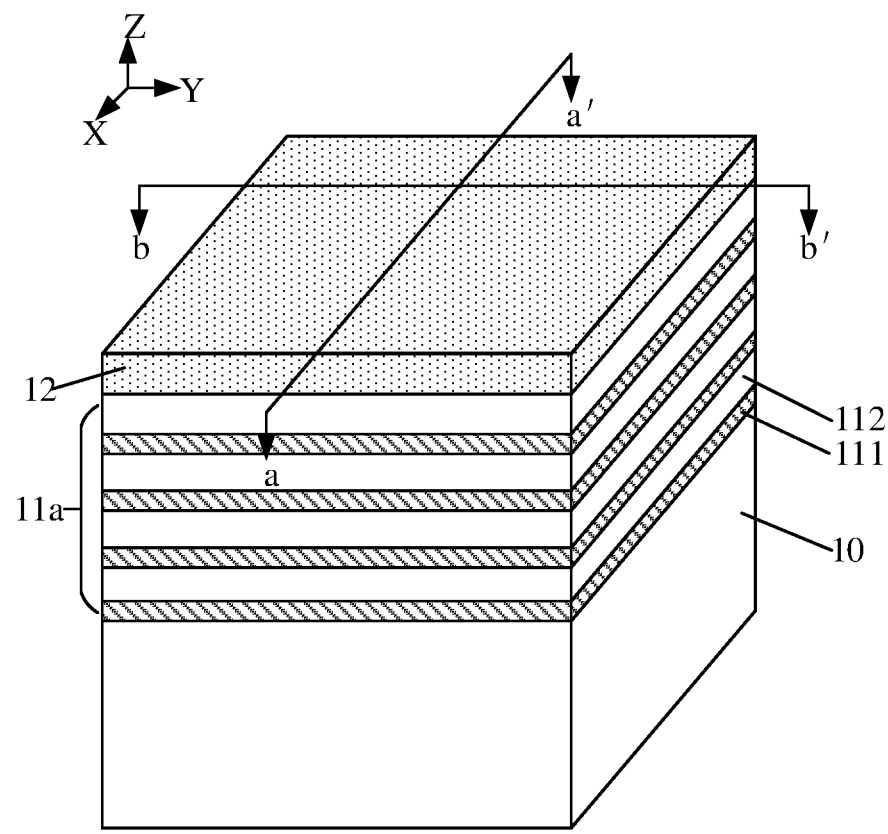
Figure 2D:
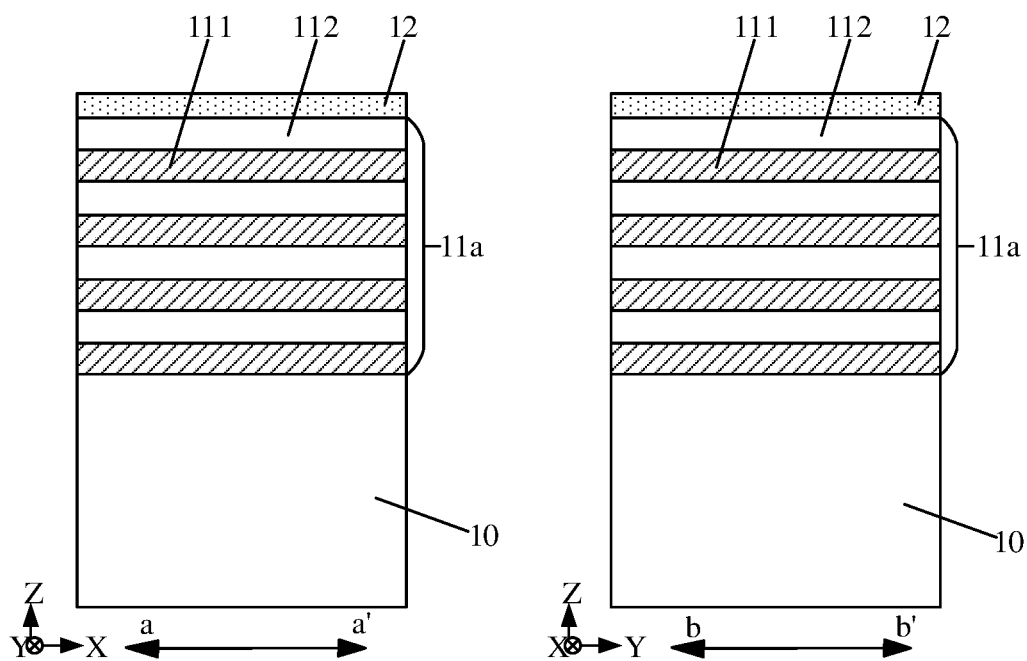
Figure 2E:
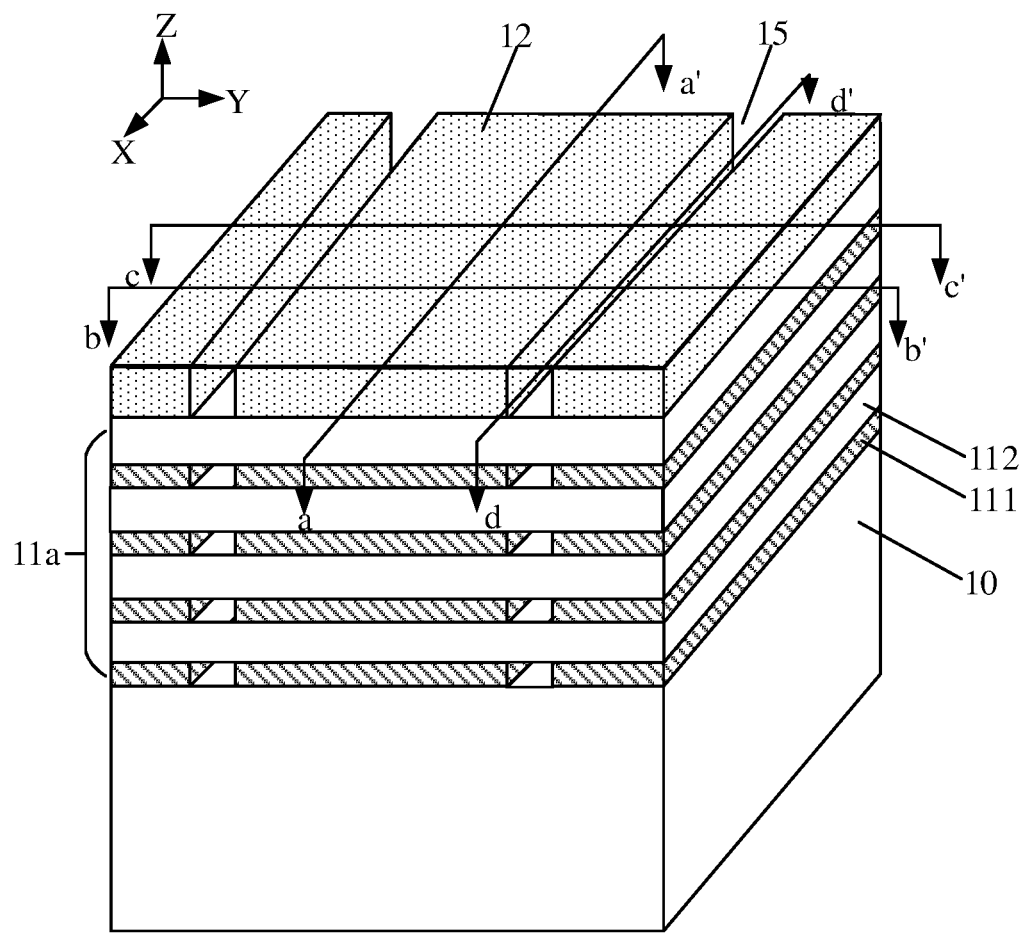
Figure 2F:
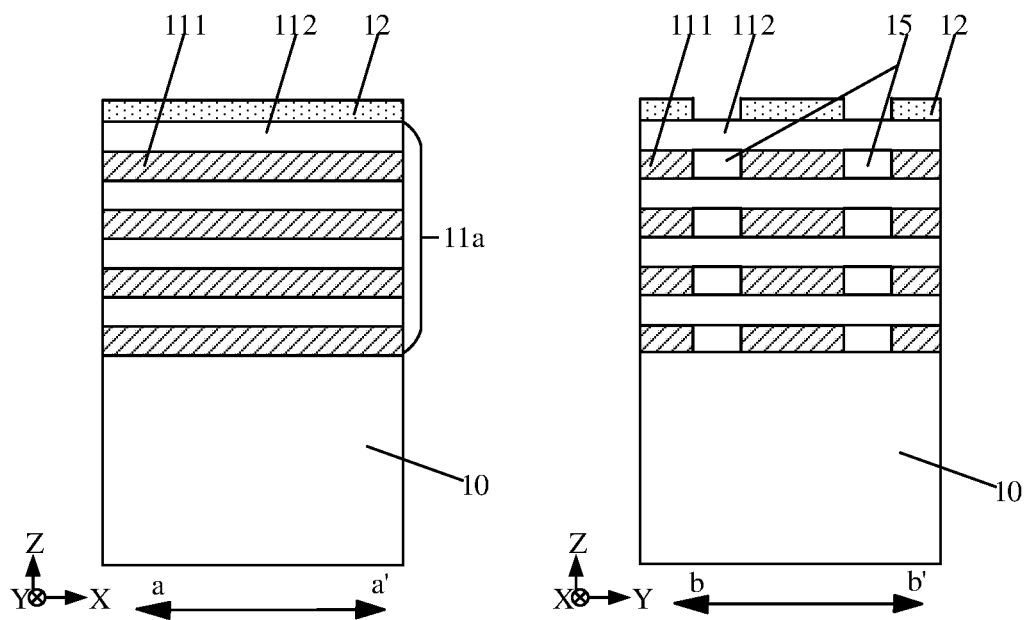
Figure 2G:
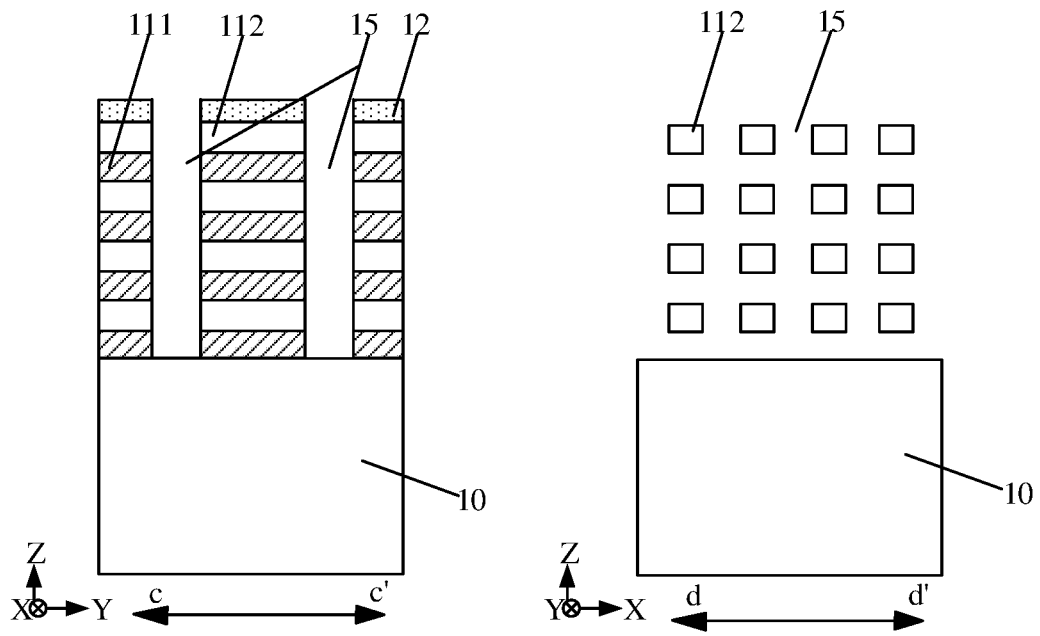
Figure 2H:
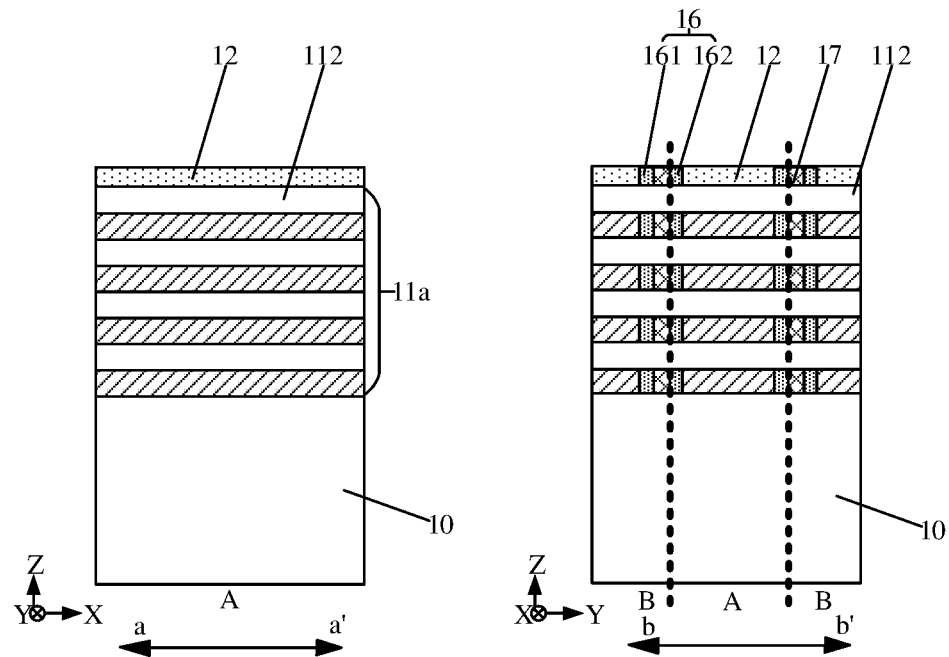
Figure 2I:
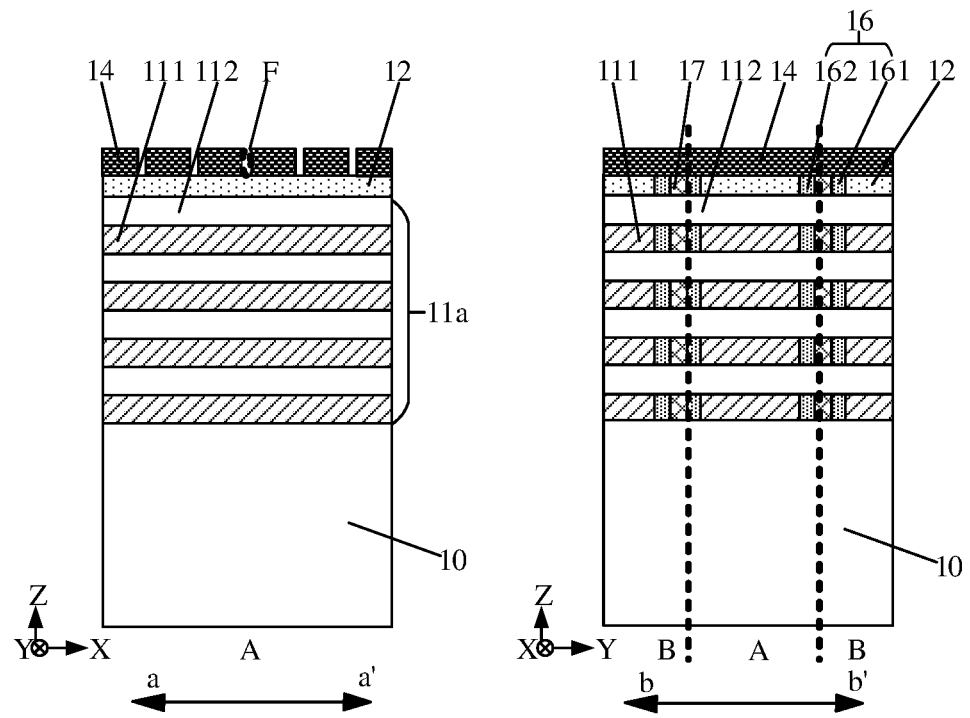
Figure 2J:
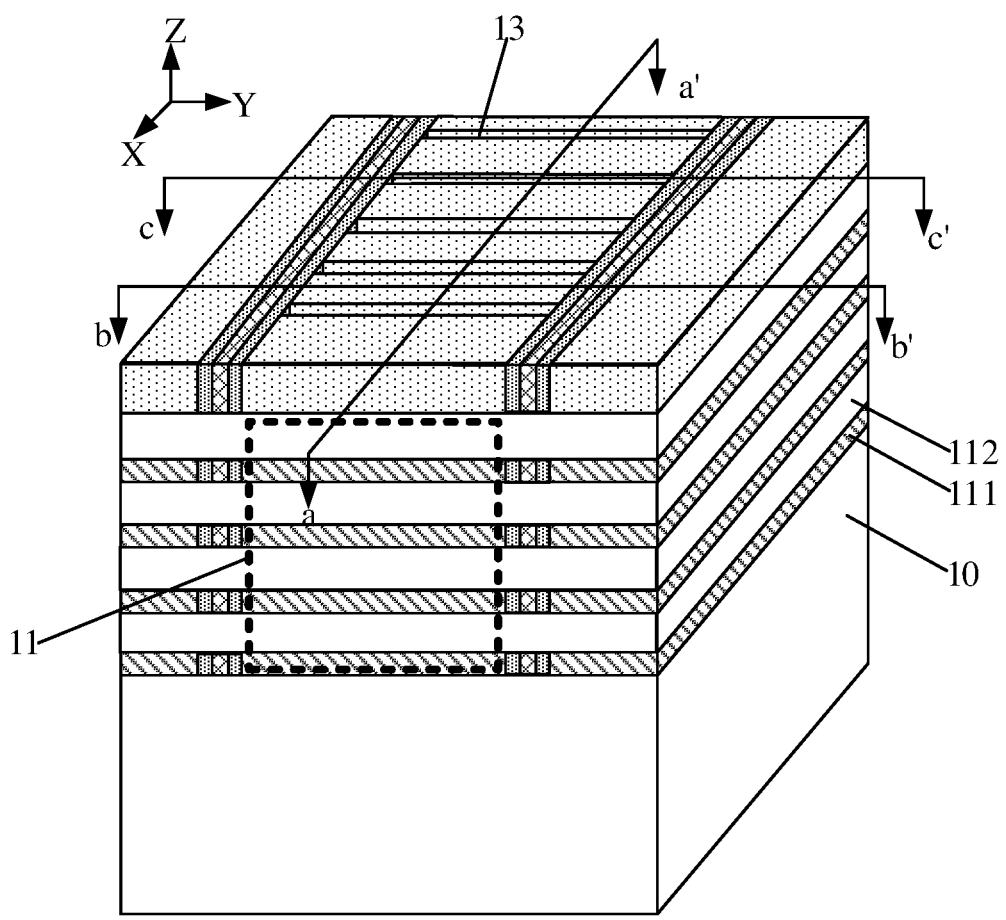
Figure 2K:
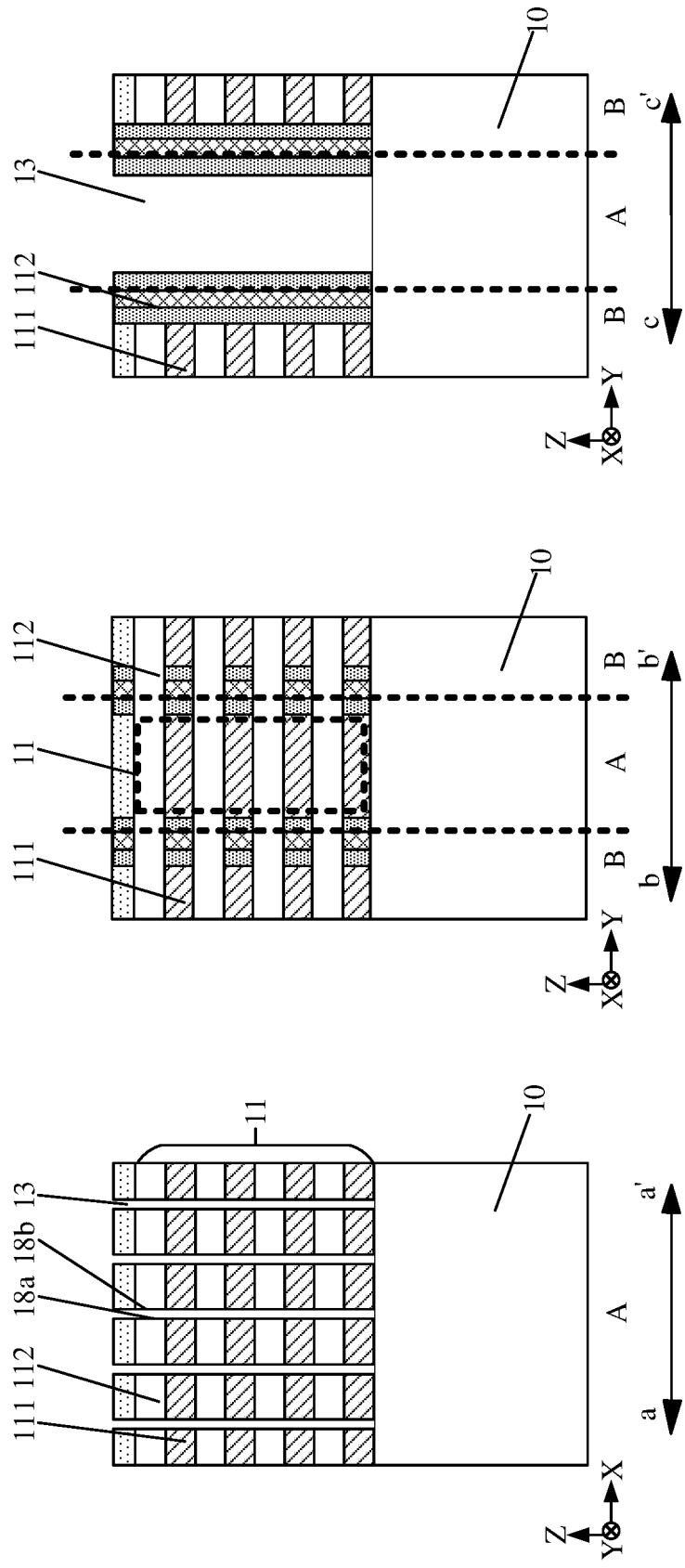
Figure 2L:
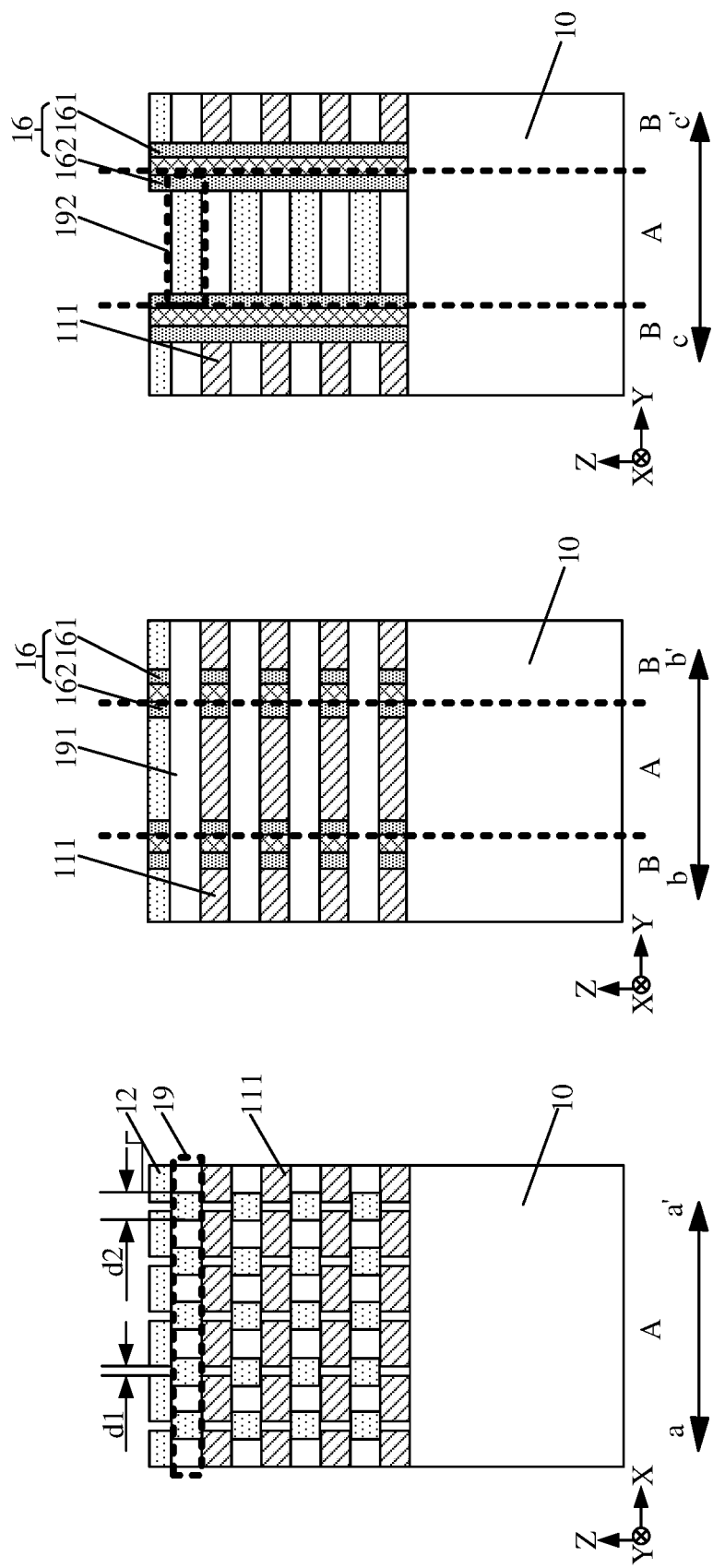
Figure 2M:
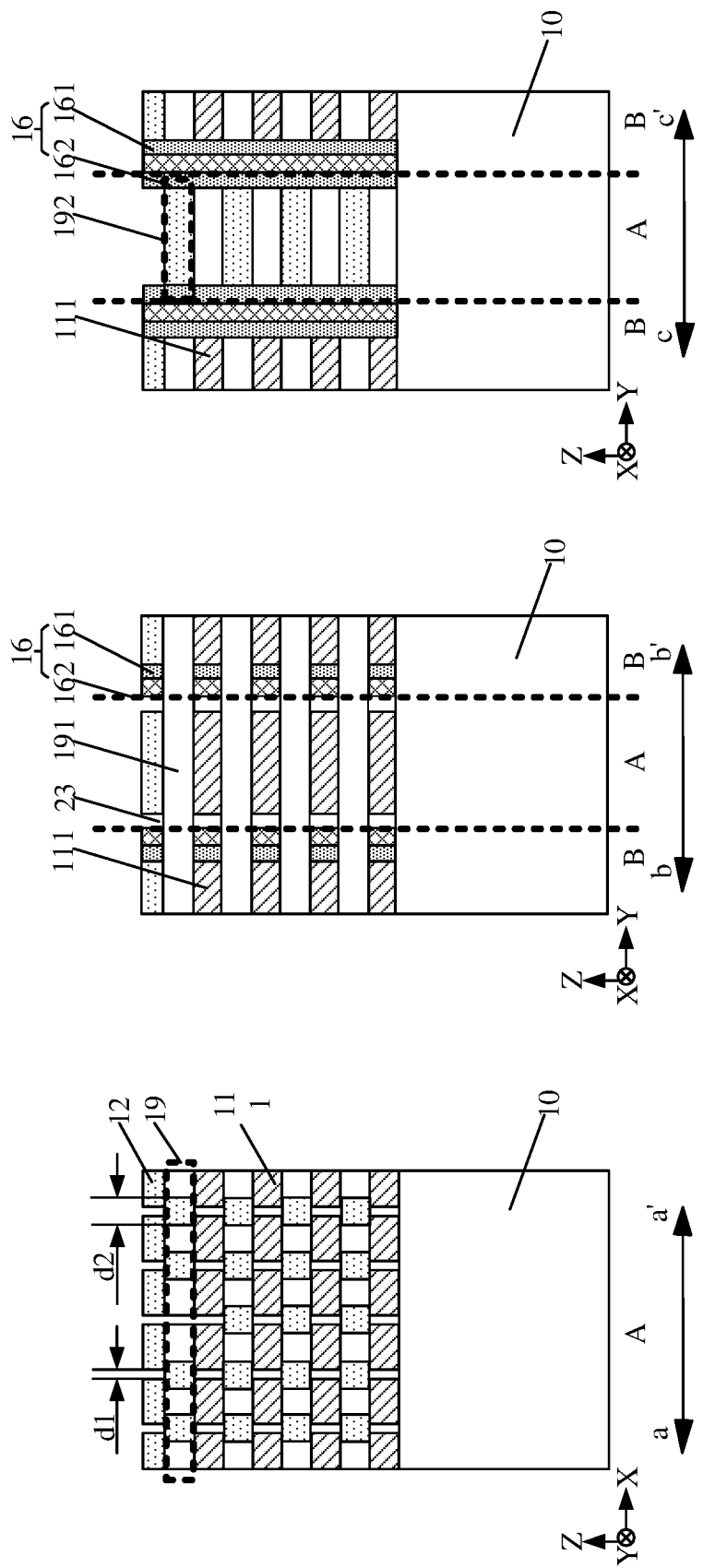
Figure 2N:
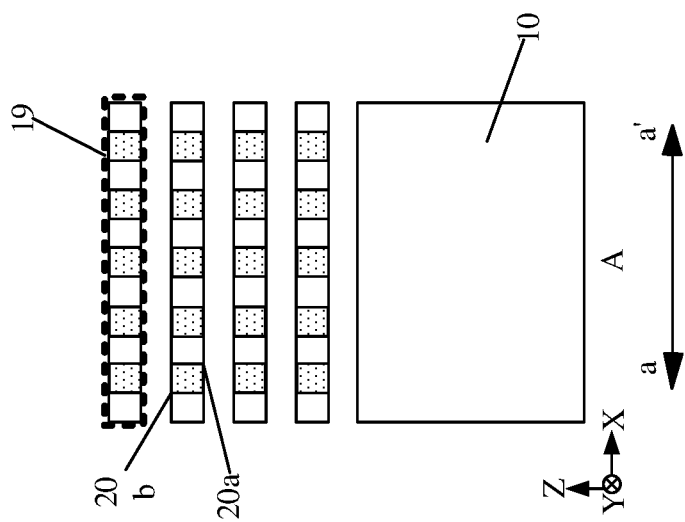
Figure 2N:
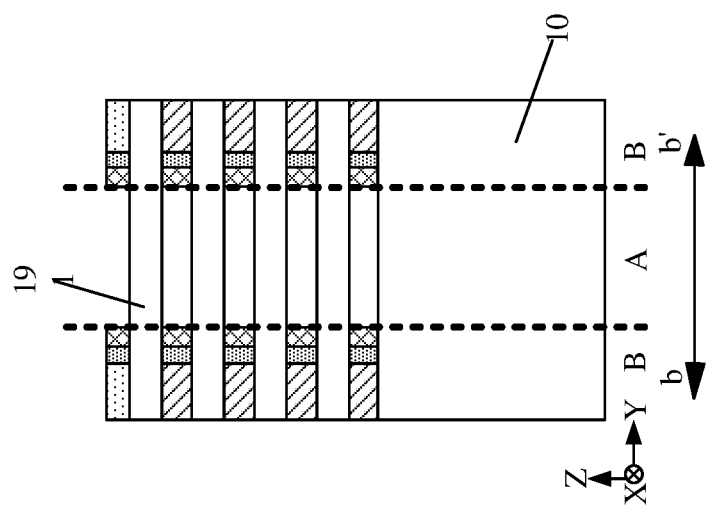
Figure 2N:
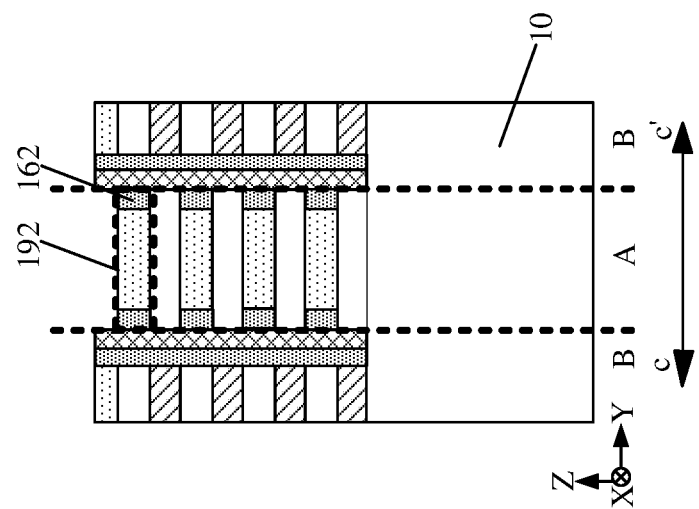
Figure 2O:
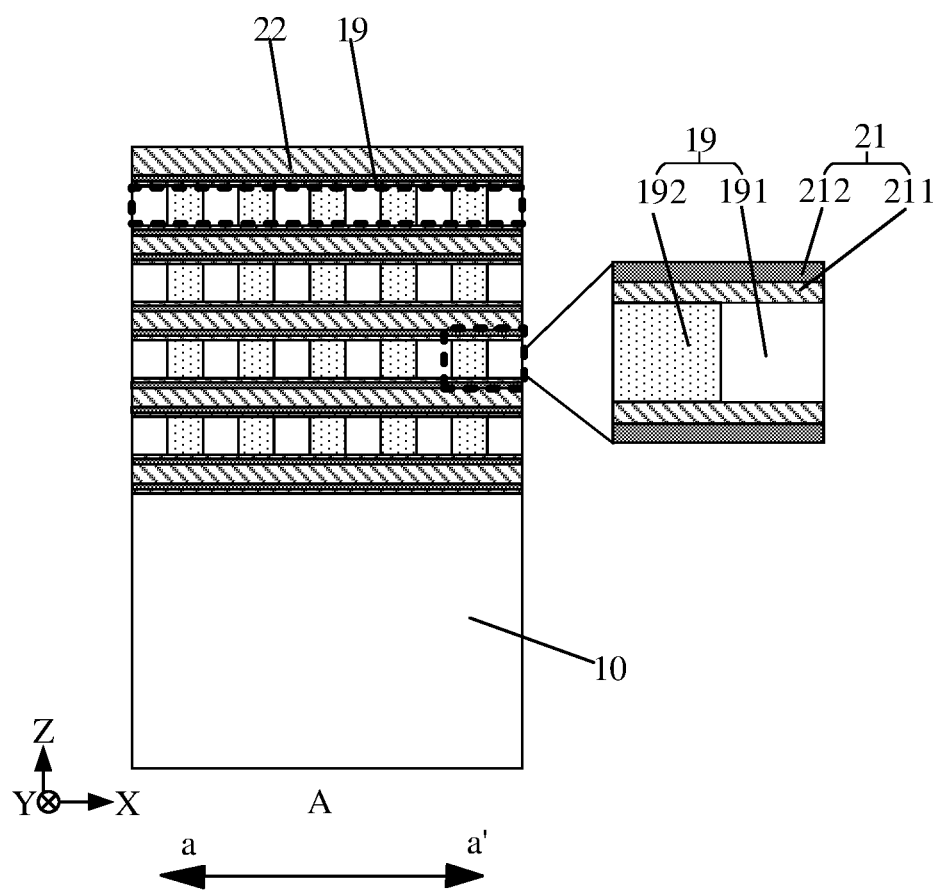
Figure 2P:
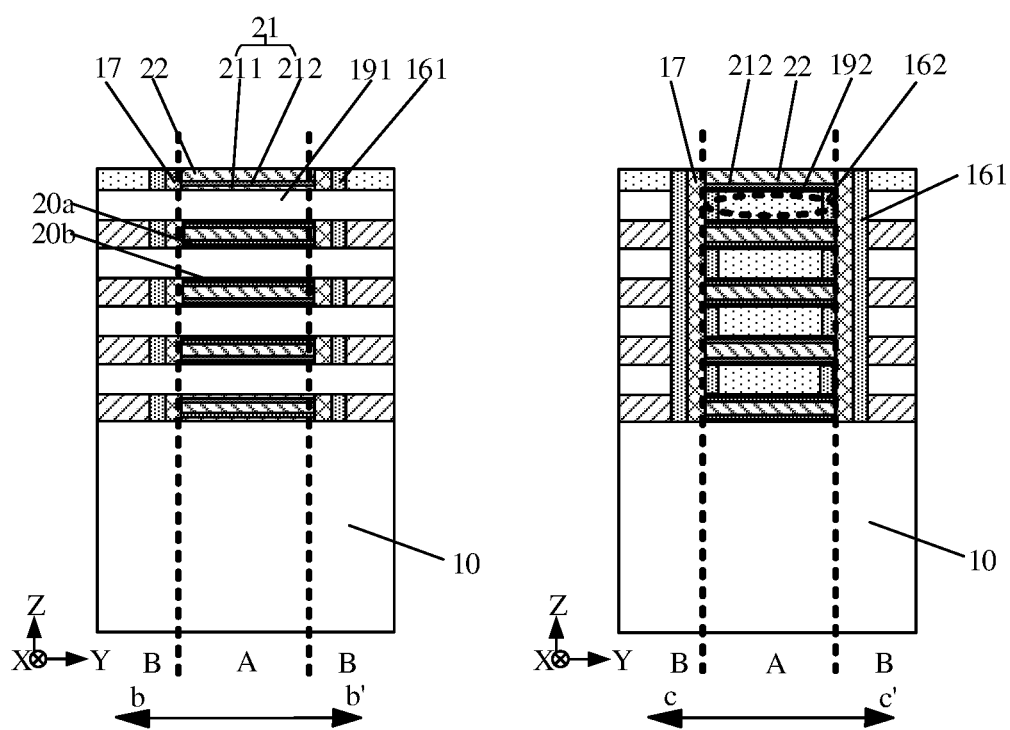

FIG. 2A to FIG. 2P illustrate schematic structural diagrams of a process for forming the semiconductor structure provided by the embodiments of the disclosure. The process for forming the semiconductor structure provided by the embodiments of the disclosure will be described below in detail with reference to FIG. 2A to FIG. 2P. FIG. 2A, FIG. 2C, FIG. 2E, and FIG. 2I are three-dimensional views. FIG. 2B, FIG. 2D, FIG. 2F to FIG. 2H, and FIG. 2J to FIG. 2P are sectional views along a-a', b-b' and c-c', and d-d' during forming the semiconductor structure.

First, reference may be made to FIG. 2A to FIG. 2K. At S101, a base is provided. The base includes a first area and second areas located outside the first area. The first area includes stack structures and isolation trenches alternately arranged in a first direction.

In some embodiments, the base includes sacrificial structures and support structures. The sacrificial structure and the support structure may be formed by the following operations. An initial stack structure is formed on a semiconductor substrate. The initial stack structure includes the first semiconductor layers and the second semiconductor layers alternately stacked in the third direction. Two etching grooves arranged in a second direction and extending in the first direction and the third direction are formed. The support structure and the sacrificial structure located on both sides of the support structure in the second direction are formed in the etching groove. An area located between the support structures constitutes the first area.

As shown in FIG. 2A and FIG. 2B, an initial stack structure 11a is formed on a surface of the semiconductor substrate 10. The initial stack structure 11a includes first semiconductor layers 111 and second semiconductor layers 112 stacked alternately in a Z-axis direction from bottom to top.

In the embodiments of the disclosure, the material of the first semiconductor layer 111 may be Ge, SiGe, or SiC, or may also be Silicon-on-Insulator (SOI) or Germanium-on-Insulator (GOI). The second semiconductor layer 112 may be a silicon layer, or may also include other semiconductor elements such as germanium, or include semiconductor compounds such as silicon carbide, gallium arsenide, gallium phosphide, indium phosphide, indium arsenide or indium antimonide, or include other semiconductor alloys such as silicon germanium, arsenic gallium phosphide, indium aluminum arsenide, gallium aluminum arsenide, indium gallium arsenide, indium gallium phosphide, and/or indium gallium arsenide phosphide, or a combination thereof.

In the embodiments of the disclosure, the number of the first semiconductor layers 111 and the second semiconductor layers 112 in the initial stack structure 11a may be set according to the required storage density. The more the first semiconductor layers 111 and the second semiconductor layers 112 are, the higher the integration degree of the semiconductor structure is.

In the embodiments of the disclosure, the first semiconductor layer 111 and the second semiconductor layer 112 may be formed by any one of the following deposition processes: an epitaxy process, a CVD process, a PVD process, an ALD process, a spin coating process, a coating process, or a thin film process or the like. For example, the first semiconductor layers 111 and the second semiconductor layers 112 may be formed on the semiconductor substrate 10 in sequence by the epitaxy process.

In some embodiments, after the initial stack structure 11a is formed, a dielectric layer 12 may also be formed on a surface of the initial stack structure 11a (as shown in FIG. 2C and FIG. 2D). The dielectric layer 12 is at least used to protect the second semiconductor layer 112 at a top surface of the stack structure 11 from being damaged during subsequent processing of the stack structure 11.

In the embodiments of the disclosure, the dielectric layer 12 may be formed by any suitable deposition process, such as a CVD process, a PVD process, an ALD process, a spin coating process, a coating process, or a furnace tube process.

Next, as shown in FIG. 2E to FIG. 2G, part of the initial stack structure 11a is removed to form two etching grooves 15 arranged in the Y-axis direction and extending in the X-axis direction. The etching groove 15 includes two crossed sub-grooves extending in the X-axis direction and the Z-axis direction. The b-b' in FIG. 2E is only sectioned to the sub-groove extending in the X-axis direction, while the c-c' in FIG. 2E is only sectioned to the sub-groove extending in the Z-axis direction. In the embodiments of the disclosure, part of the initial stack structure 11a may be removed by a selective etching process.

It is to be noted that an etching groove 15 is also formed in the dielectric layer 12 (as shown in FIG. 2E to FIG. 2G).

As shown in FIG. 2H, a sacrificial material is deposited on two side walls of the etching groove 15 in the Y-axis direction to form a sacrificial structure 16. The sacrificial structure 16 includes a first sacrificial layer 161 and a second sacrificial layer 162. Then, a support material is filled in a void between the first sacrificial layer 161 and the second sacrificial layer 162, so as to form a support structure 17. In the embodiments of the disclosure, an area located between the support structures 17 in the Y-axis direction constitutes a first area A, and the other area located outside the first area A constitutes second areas B. The first sacrificial layer 161 is located in the second area B, and the second sacrificial layer 162 is located in the first area A.

In the embodiments of the disclosure, both the sacrificial structure 16 and the support structure 17 may be formed by any suitable deposition process. The sacrificial material may be a Spin On Hard Mask (SOH) material, a low-dielectric constant (Low K) material, or other suitable materials. The support material may be silicon nitride or silicon carbonitride.

In the embodiments of the disclosure, the support structure 17 may be used to support a subsequently formed gate structure or other functional structures, so as to improve the stability of the semiconductor structure.

In the embodiments of the disclosure, the substrate is divided into a first area and second areas through the support structure. The dimension of the first area in the second direction determines the dimension of a channel in the gate structure, so that the dimension of the channel in the gate structure can be adjusted by adjusting the position of the support structure, thereby adjusting the control capability of the gate structure, and thus improving the performance of the formed semiconductor structure.

In some embodiments, the etching selectivity of the sacrificial structure 16 to the second semiconductor layer 112 is greater than that of the support structure 17 to the second semiconductor layer 112.

In the embodiments of the disclosure, the first sacrificial layer 161 in the sacrificial structure 16 may be used to define the positions of a source and a drain. The second sacrificial layer 162 in the sacrificial structure 16 is used to facilitate the subsequent removal of the second semiconductor layers from the stack structure. Therefore, during implementation, the second sacrificial layer 162 and the first sacrificial layer 161 need to be removed to realize a subsequent process. Thus, the etching selectivity of the sacrificial structure 16 to the second semiconductor layer 112 needs to be set to be greater than the etching selectivity of the support structure 17 to the second semiconductor layer 112. That is, the etching selectivity of the second sacrificial layer 162 to the second semiconductor layer 112 is set to be greater than the etching selectivity of the support structure 17 to the second semiconductor layer 112, and the etching selectivity of the first sacrificial layer 161 to the second semiconductor layer 112 is set to be greater than the etching selectivity between the support structure 17 and the second semiconductor layer 112, so that the second sacrificial layer 162 and the first sacrificial layer 161 are etched and removed more easily relative to the support structure 17 during etching.

In some embodiments, after the sacrificial structure and the support structure are formed, the stack structure and the isolation trench are formed. The stack structure and the isolation trench may be formed by the following operations. A mask layer with a preset pattern is formed on a surface of the initial stack structure. The preset pattern includes a plurality of sub-patterns arranged in the first direction, and the sub-patterns expose part of the initial stack structure located in a first area. The part of the initial stack structure exposed by the sub-patterns is removed through the mask layer to form stack structures and the isolation trenches alternately arranged in the first direction.

In the embodiments of the disclosure, referring to FIG. 2I, the dielectric layer 12 is located on a surface of the initial stack structure 11a. A mask layer 14 with a preset pattern is formed on the surfaces of the dielectric layer 12, the support structure 17, and the sacrificial structure 16. The preset pattern exposes part of the dielectric layer 12 located in the first area A. The mask layer 14 with the preset pattern includes a plurality of sub-preset patterns F arranged in the first direction.

In the embodiments of the disclosure, the material used by the mask layer 14 with the preset pattern may be one or more of silicon oxide, silicon nitride, silicon carbide, or silicon oxynitride.

As shown in FIG. 2J and FIG. 2K, the dielectric layer 12 and the initial stack structure 11a exposed by the preset pattern are removed in sequent through the mask layer 14 with the preset pattern, so as to form the stack structures 11 and the isolation trenches 13.

In the embodiments of the disclosure, the exposed dielectric layer 12 and initial stack structure 11a may be etched and removed by a High Aspect Ratio (HAR) technology, so as to form the stack structures 11 and the isolation trenches 13.

In the embodiments of the disclosure, the second semiconductor layer 112 in the formed stack structure 11 includes a first surface 18a and a second surface 18b in the X-axis direction.

Then, reference may be made to FIG. 2L to FIG. 2N. S102 is performed in which ion implantation is performed on sidewalls of the stack structure in the first direction, so as to form an active virtual connecting layer extending in the first direction and partially located in the isolation trenches.

In the embodiments of the disclosure, as shown in FIG. 2L, ion implantation at a preset depth is performed on two ends of the second semiconductor layer 112 in the stack structure 11 in the X-axis direction respectively, that is, the ion implantation at the preset depth is performed on the first surface 18a and the second surface 18b to form a virtual connecting layer 192. The second semiconductor layer 112 not subjected to the ion implantation constitutes the active layer 191.

During implementation, by a PLAD technology, ion implantation is performed on the second semiconductor layer 112 with a preset depth along a first surface 18a, and an annealing process is performed to form a first virtual connecting layer extending into the isolation trench 13. Ion implantation is performed on the second semiconductor layer 112 with a preset depth along a second surface 18b, and an annealing process is performed to form a second virtual connecting layer extending into the isolation trench 13. That is, the ion implantation is performed along the first surface 18a and the second surface 18b simultaneously, and an annealing process is performed simultaneously, so as to form the first virtual connecting layer and the second virtual connecting layer extending into the isolation trench 13. The first virtual connecting layer and the second virtual connecting layer located in a same isolation trench 13 constitute the virtual connecting layer 192.

In some embodiments, the isolation trench 13 has a first dimension d1 in the first direction. The virtual connecting layer 192 has a second dimension d2 in the first direction. The first dimension d1 is less than or equal to a preset multiple of the second dimension d2. For example, the preset multiple may be 0.54.

In some embodiments, as shown in FIG. 2M, the method for forming a semiconductor structure further includes that: after the active virtual connecting layer is formed, the second sacrificial layer 162 located in the projection area of the first semiconductor layer in the second direction in the first area is removed to form a plurality of first openings 23 arranged in the X-axis direction, the Y-axis direction, and the Z-axis direction.

In the embodiments of the disclosure, the first openings 23 formed are used to facilitate subsequent removal of the first semiconductor layer 111.

In some embodiments, as shown in FIG. 2N, the method for forming a semiconductor structure further includes that: after the second sacrificial layer is removed, the first semiconductor layer 111 is removed.

In the embodiments of the disclosure, the first semiconductor layer 111 located in the first area A may be removed through the first openings 23 by a selective etching process.

In the embodiments of the disclosure, referring to FIG. 2N again, the method for forming a semiconductor structure further includes that: after the first semiconductor layer 111 located in the first area A is removed, a second sacrificial layer 162 in the projection area of the first opening 23 in the X-axis direction is removed. The remaining second sacrificial layer 162 also constitutes a part of the virtual connecting layer 192.

In the embodiments of the disclosure, referring to FIG. 2N again, the active virtual connecting layer 19 has a third surface 20a and a fourth surface 20b in the Z-axis direction.

In others embodiments, the method for forming a semiconductor structure further includes that: a thinning process is performed on the active virtual connecting layer 19. The formed virtual connecting layer can become cylindrical by the thinning process, that is, a section of the active virtual connecting layer in the third direction is closer to a circle, so that the electric leakage of the semiconductor structure can be reduced. In addition, a void between adjacent active layers in the third direction can become larger by thinning, which facilitates subsequent formation of the gate structure better, thereby reducing the process complexity of the gate structure and thus reducing the manufacturing cost of the semiconductor structure.

Finally, referring to FIG. 2O and FIG. 2P, S103 is performed so as to form a gate structure on a surface of the active virtual connecting layer.

In some embodiments, the gate structure is formed by the following operation. A gate dielectric layer and a gate conductive layer located on a surface of the gate dielectric layer are formed on a third surface and a fourth surface of the active virtual connecting layer in third direction in sequence.

In combination with FIG. 2N, FIG. 2O, and FIG. 2P, a gate dielectric material and a gate conductive material are deposited on the third surface 20a and the fourth surface 20b of the active virtual connecting layer 19 in the Z-axis direction in sequence to form a gate dielectric layer 211 and a gate conductive layer 212. The gate structure 21 includes the gate dielectric layer 211 and the gate conductive layer 212 located on the surface of the gate dielectric layer 211.

In the embodiments of the disclosure, the gate dielectric material may be silicon oxide or other suitable materials. The gate conductive material may be any one of the materials with good electrical conductivity, such as titanium (Ti), titanium nitride (TiN), tungsten (W), cobalt (Co), platinum (Pt), palladium (Pd), ruthenium (Ru), and Copper (Cu).

In the embodiments of the disclosure, the gate dielectric layer 211 and the gate conductive layer 212 may be formed by any suitable deposition process, such as a CVD process, a PVD process, and an ALD process.

In the embodiments of the disclosure, the gate structure 21 may be a dual gate structure. The gate conductive layer 212 located on a surface of the virtual connecting layer 192 may serve as a word line to connect two adjacent gate structures in a same layer.

In the embodiments of the disclosure, the gate conductive layer is formed on a surface of the active virtual connecting layer. The gate conductive layer located on a surface of the virtual connecting layer may serve as a word line to realize the connection between two adjacent gate structures in the same layer.

In some embodiments, referring to FIG. 2O and FIG. 2P again, the method for forming a semiconductor structure further includes that: after the gate structure 21 is formed, a second isolation structure 22 is formed in a void between the gate conductive layers 212.

In the embodiments of the disclosure, a second isolation material is filled in a void between the gate conductive layers 212 to form a second isolation structure 22. The second isolation material and the first isolation material may be the same, or may also be different.

In the embodiments of the disclosure, the second isolation structure 22 is used for isolating two adjacent gate structures in the third direction, so as to reduce the generation of leakage current, thereby improving the yield of the semiconductor structures.

In the embodiments of the disclosure, the method for forming a semiconductor structure further includes that: after the second isolation structure 22 is formed, the first sacrificial layer 161 is removed to form a second opening (not shown), and ion implantation is performed on the active layer 191 through the second opening, so as to form a source and a drain.

In the embodiments of the disclosure, a virtual connecting layer connecting two active layers in a first direction is formed during forming a semiconductor structure. The virtual connecting layer facilitates subsequent formation of a gate metal layer connecting gate structures in a same layer. In addition, the virtual connecting layer can serve as an electron barrier layer to isolate two adjacent gate structures in the first direction, which reduces the generation of leakage current, thereby improving the yield of the manufactured semiconductor structures. In the embodiments of the disclosure, the formed semiconductor structure has horizontal gate structures, and the gate structures are stacked in a third direction. A stack structure formed by stacking a plurality of gate structures in the third direction may form a three-dimensional semiconductor structure, so that the integration degree of the semiconductor structure can be improved and miniaturization can thus be realized.

Figure 3A:
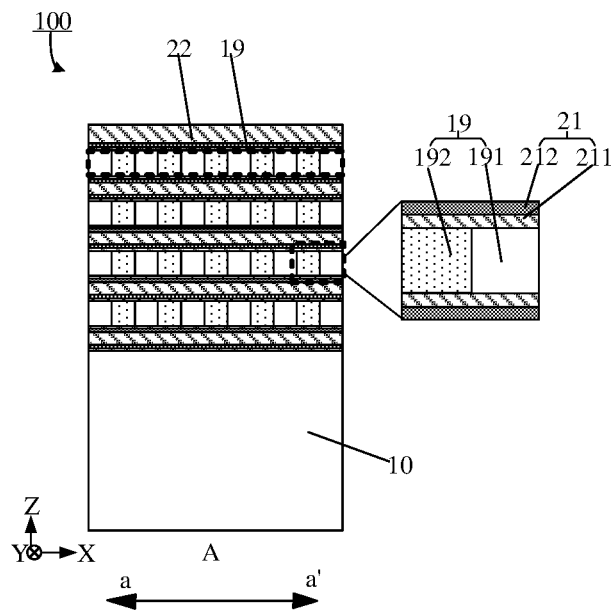
FIG. 3A and FIG. 3B illustrate schematic structural diagrams of a semiconductor structure provided by the embodiments of the disclosure.
Figure 3B:
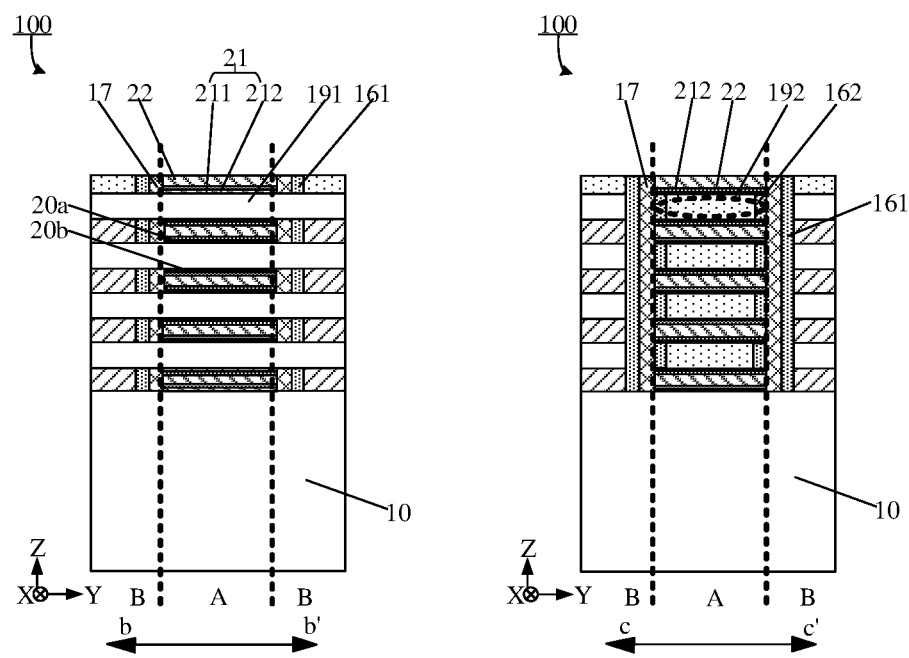

In addition, embodiments of the disclosure further provide a semiconductor structure. FIG. 3A and FIG. 3B illustrate schematic structural diagrams of the semiconductor structure provided by the embodiments of the disclosure. As shown in FIG. 3A and FIG. 3B, the semiconductor structure 100 at least includes: a semiconductor substrate 10 including a first area A and a second areas B arranged outside the first area A; active virtual connecting layers 19 extending in the X-axis direction, the active virtual connecting layers 19 being located in the first area A and being arranged at intervals in the Z-axis direction; and gate structures 21 located on surfaces of the active virtual connecting layers 19.

In some embodiments, referring to FIG. 3A and FIG. 3B again, the active virtual connecting layer 19 includes active layers 191 and virtual connecting layers 192 arranged alternately in the X-axis direction. The virtual connecting layer 192 is located in a projection area of the active layer 191 in the X-axis direction.

In some embodiments, referring to FIG. 3B again, the semiconductor structure 100 further includes: support structures 17. The support structures 17 are arranged at intervals in the Y-axis direction and extend in the X-axis direction. An area between two support structures 17 arranged in the Y-axis direction constitutes a first area A.

In some embodiments, referring to FIG. 3B again, the semiconductor structure 100 further includes: first sacrificial layers 161. The first sacrificial layers 161 are arranged at intervals in the Y-axis direction and extend in the X-axis direction and the Z-axis direction. The first sacrificial layers 161 are located in the second area B, and are located on one side of the support structure 17 in the Y-axis direction.

In some embodiments, referring to FIG. 3B again, the semiconductor structure 100 further includes second sacrificial layers 162. The second sacrificial layer 162 constitutes a part of the virtual connecting layer 19.

In some embodiments, referring to FIG. 3A and FIG. 3B again, the gate structure 21 covers the third surface 20a and the fourth surface 20b of the virtual connecting layer 19 in the Z-axis direction. The gate structure 21 includes a gate dielectric layer 211 and a gate conductive layer 212 located on the surface of the gate dielectric layer 211. The gate conductive layer 212 located on the surface the virtual connecting layer 192 may serve as a word line.

In some embodiments, referring to FIG. 3A and FIG. 3B again, the semiconductor structure 100 further includes: a second isolation structure 22 located between the gate conductive layers 212.

The semiconductor structure provided by the embodiments of the disclosure is similar to the method for forming a semiconductor structure in the abovementioned embodiments. The technical features not disclosed in detail in the embodiments of the disclosure is understood with reference to the abovementioned embodiments, and will not be elaborated herein.

The semiconductor structure provided by the embodiments of the disclosure at least includes a virtual connecting layer. On one hand, the virtual connecting layer can connect two active layers arranged in the first direction, and facilitate subsequent formation of a gate metal layer connecting the gate structures in a same layer. On the other hand, the virtual connecting layer can serve as an electron barrier layer to isolate the two adjacent gate structures in the first direction, so as to reduce the generation of leakage current, thereby improving the yield of the manufactured semiconductor structures. In addition, the gate structures in the embodiments of the disclosure are horizontal, and a stack structure formed by stacking a plurality of horizontal gate structures in a third direction may form a three-dimensional semiconductor structure, so that the integration degree of the semiconductor structure can be improved, and miniaturization can thus be realized.

In several embodiments provided by the disclosure, it is to be understood that the disclosed device and method may be implemented in a non-target mode. The above described device embodiments are only schematic. For example, the division of the units is only a logical function division. In actual implementation, there may be other division modes, for example, a plurality of units or components may be combined, or may be integrated into another system, or some features may be ignored or not implemented. In addition, the components shown or discussed are coupled to each other, or directly coupled.

The characteristics disclosed in several method or device embodiments provided in the disclosure may be freely combined without conflicts to obtain new method embodiments or device embodiments.

The abovementioned descriptions are only some implementation modes of the disclosure, but the scope of protection of the disclosure is not limited thereto. Any variation or replacement readily figured out by a person skilled in the art within the technical scope disclosed in the disclosure shall fall within the scope of the protection of the disclosure. Therefore, the scope of the protection of the disclosure shall be subject to the scope of protection of the claims.

INDUSTRIAL APPLICABILITY

In the embodiments of the disclosure, a virtual connecting layer connecting two active layers in a first direction is formed during forming a semiconductor structure. The virtual connecting layer can facilitate subsequent formation of a gate metal layer connecting gate structures in a same layer, which simplifies a process of the gate structures, and thus reduces the manufacturing cost of the semiconductor structure. In addition, the virtual connecting layer can also serve as an electronic barrier layer to isolate adjacent gate structures in a same layer, which reduces the generation of leakage current, thereby improving the yield of the manufactured semiconductor structures.

The invention claimed is:

1. A method for forming a semiconductor structure, comprising:
   providing a base comprising a first area and second areas located outside the first area, wherein the first area comprises stack structures and isolation trenches alternately arranged in a first direction, the first direction being any direction in a plane where the base is located;
   performing ion implantation on sidewalls of the stack structure in the first direction, so as to form an active virtual connecting layer extending in the first direction and partially located in the isolation trenches; and
   forming a gate structure on a surface of the active virtual connecting layer.

2. The method of claim 1, wherein the stack structure comprises first semiconductor layers and second semiconductor layers alternately stacked in a third direction; and the active virtual connecting layer comprises active layers and virtual connecting layers alternately arranged in the first direction; wherein the active layer and the virtual connecting layer are formed by following operation:
   performing ion implantation at a preset depth on two ends of the second semiconductor layer in the stack structure in the first direction to form the virtual connecting layer, wherein the second semiconductor layer not subjected to the ion implantation constitutes the active layer,
   wherein the preset depth is less than an initial dimension of the second semiconductor layer in the stack structure, and the third direction intersects a plane where the base is located.

3. The method of claim 2, further comprising: after performing ion implantation at a preset depth on two ends of the second semiconductor layer in the stack structure in the first direction,
   performing an annealing process on the second semiconductor layer after the ion implantation.

4. The method of claim 3, wherein the second semiconductor layer comprises a first surface and a second surface in the first direction; and the virtual connecting layer is formed by following operations:
   performing the ion implantation and the annealing process on the second semiconductor layer along the first surface, so as to form a first virtual connecting layer extending in the first direction; and
   performing the ion implantation and the annealing process on the second semiconductor layer along the second surface, so as to form a second virtual connecting layer extending in the first direction;
   wherein the first virtual connecting layer and the second virtual connecting layer located in a same isolation trench constitute the virtual connecting layer.

5. The method of claim 4, wherein the isolation trench has a first dimension in the first direction; and
   the virtual connecting layer has a second dimension in the first direction;
   wherein the first dimension is less than or equal to a preset multiple of the second dimension.

6. The method of claim 5, wherein the preset multiple is 0.54.

7. The method of claim 2, further comprising: after forming the active virtual connecting layer and before forming the gate structure,
   performing a thinning process on the active virtual connecting layer.

8. The method of claim 7, wherein the base further comprises sacrificial structures and support structures; wherein the sacrificial structure and the support structure are formed by following operations:
   forming an initial stack structure on a semiconductor substrate, wherein the initial stack structure comprises the first semiconductor layers and the second semiconductor layers alternately stacked in the third direction;
   removing part of the initial stack structure to form two etching grooves arranged in a second direction and extending in the first direction and the third direction, wherein the second direction and the first direction are located in a same plane; and
   forming the support structure and the sacrificial structure located on both sides of the support structure in the second direction in the etching groove, wherein an area located between the support structures constitutes the first area.

9. The method of claim 8, wherein the sacrificial structure comprises a first sacrificial layer located in the first area and a second sacrificial layer located in the second areas.

10. The method of claim 9, wherein an etching selectivity of the sacrificial structure to the second semiconductor layer is greater than an etching selectivity of the support structure to the second semiconductor layer.

11. The method of claim 10, wherein the stack structures and the isolation trenches are formed after the sacrificial structure and the support structure are formed;
   the stack structures and the isolation trenches are formed by following operations:
   forming a mask layer with a preset pattern on a surface of the initial stack structure, wherein the preset pattern comprises a plurality of sub-patterns arranged in the first direction; the sub-patterns expose part of the initial stack structure located in the first area; and
   removing the part of the initial stack structure exposed by the sub-patterns by the mask layer to form the stack structures and the isolation trenches alternately arranged in the first direction.

12. The method of claim 9, further comprising: after forming the active virtual connecting layer,
   removing the second sacrificial layer located in a projection area of the first semiconductor layer in the second direction in the first area to form a plurality of first openings.

13. The method of claim 12, further comprising: after removing the second sacrificial layer,
   removing the first semiconductor layer.

14. The method of claim 13, wherein the gate structure is formed by following operation:
   forming a gate dielectric layer and a gate conductive layer located on a surface of the gate dielectric layer on a third surface and a fourth surface of the active virtual connecting layer in the third direction in sequence.

15. The method of claim 14, further comprising: after forming the gate structure,
   forming a second isolation structure in a void between gate conductive layers.

16. The method of claim 8, wherein the first semiconductor layer comprises a silicon germanium layer; and the second semiconductor layer comprises a silicon layer.

* * * * *